United States Patent [19]

Sogame

[11] Patent Number: 4,769,643

[45] Date of Patent: Sep. 6, 1988

[54] TRANSMITTER DRIVER FOR PROGRAMMABLE REMOTE CONTROL TRANSMITTER

[75] Inventor: Akira Sogame, Higashi-Osaka, Japan

[73] Assignee: General Electric Company, Schenectady, N.Y.

[21] Appl. No.: 941,457

[22] Filed: Dec. 15, 1986

[30] Foreign Application Priority Data

Feb. 7, 1986 [JP]  Japan ................................. 61-24230

[51] Int. Cl.⁴ .......................... H04N 5/44; H04Q 7/02
[52] U.S. Cl. ........................... 340/825.690; 358/194.1;
455/603
[58] Field of Search ....................... 455/603, 618, 608;
340/825.69, 825.72, 825.57; 358/194.1

[56] References Cited

U.S. PATENT DOCUMENTS

| | | | |
|---|---|---|---|
| 4,481,676 | 11/1984 | Eumurian et al. ................... | 455/608 |
| 4,514,732 | 4/1985 | Hayes, Jr. ....................... | 340/825.57 |
| 4,517,564 | 5/1985 | Morishita et al. ............... | 340/825.69 |
| 4,623,887 | 11/1986 | Welles, II ....................... | 340/825.72 |
| 4,703,359 | 10/1987 | Rumbolt et al. ................ | 340/825.72 |

Primary Examiner—Donald J. Yusko
Attorney, Agent, or Firm—Eugene M. Whitacre; Carlos Nieves; Peter M. Emanuel

[57] ABSTRACT

A transmitter driver of this invention is applied to a programmable remote control transmitter for receiving remote control codes for remote-controlling various electric devices in the learning mode and for remote-controlling the electric devices according to the received remote control codes in the remote control mode. The transmitter driver has an output transistor for driving a transmitter constituting a part of a load upon reception of electrical pulses representing the remote control codes, a resistor device arranged between the output side of the output transistor and a given reference potential, and a control transistor device, output electrodes of which are arranged between one end of the resistor device at the side of the output transistor and the reference potential. An input terminal of the control transistor device receives a control signal corresponding to an output signal format of remote control codes necessary for controlling an electric device selected by a user.

4 Claims, 4 Drawing Sheets

| INPUT REMOTE CONTROL CODE || PRESET BIN CODE |
|---|---|---|
| THE NUMBER OF PULSES CONSTITUTING PULSE BURST PERIOD | PULSE OFF PERIOD | |
| 5 | | A |
| 3 | | B |
| | 100ms | C |
| | 50ms | D |

(NOTE) PULSE BURST FREQUENCY 40KHZ

FIG.3

| COMBINATION OF ADJACENT BIN CODES | PRESET BIN PAIR CODE |
|---|---|
| A B | I |
| C D | II |
| A C | III |

FIG.4

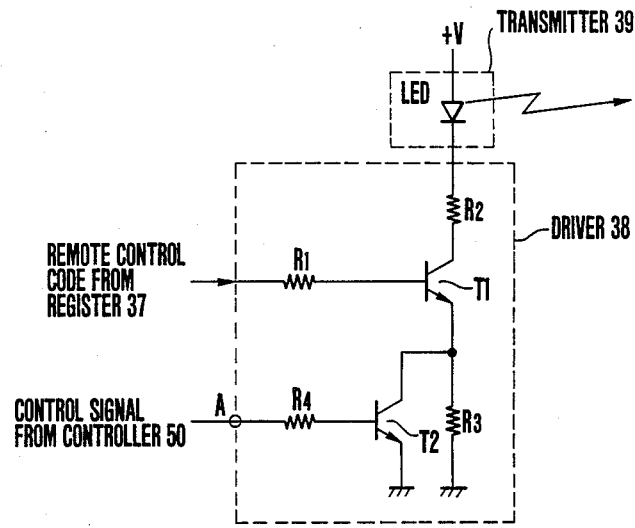
F I G. 5
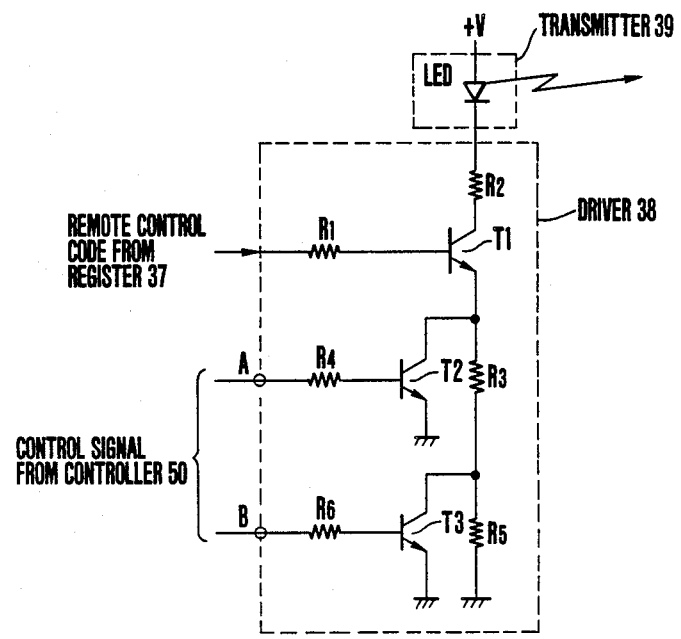
F I G. 6

TRANSMITTER DRIVER FOR PROGRAMMABLE REMOTE CONTROL TRANSMITTER

BACKGROUND OF THE INVENTION

The present invention relates to a programmable remote control transmitter and, more particularly, to an transmitter driver for a programmable remote control transmitter to emulate any one of transmitters for remote-controlling electrical devices.

Various types of electronic products have been used at home to provide convenience in daily life in recent years. Most electric products have so-called remote controllers as transmitters for electrically remote-controlling the electric devices. Since every electric device a transmission system of a unique type, a another electric device. If the number of electric devices is increased, the number of types of transmitters is accordingly increased. When a large number of remote controllable electric devices are installed in a house, the user is often confused of selecting a transmitter appropriate for each electric device.

In order to solve this problem, the present applicant has proposed a programmable remote control transmitter. This programmable remote control transmitter receives various remote control codes from all transmitters used in the house and decodes these codes. The decoded remote control codes are stored in a memory. Where the remote control transmitter is used, a type of the electric device to be available is selected and the selected electric device is irradiated with ultrasonic waves or infrared rays, thereby controlling the electric device in accordance with data stored in the memory which corresponds to the remote control codes of the selected electric device. Such a conventional programmable remote control transmitter is described in detail in Japanese patent prepublication No. 60-254898 which corresponds to U.S. Pat. No. 4,623,887 issued to K. B. Welles, II on Nov. 18, 1986.

However, with this arrangement, electric devices to be controlled have different output signal formats. For this reason, since the operating characteristics of a transmitter differ in accordance with the output signal formats, it is difficult to drive the transmitter under the optimal operating conditions. In other words, a transmitter driver used in the remote control transmitter normally comprises an output transistor for receiving an electrical signal representing a remote control code and a transmitter, such as a light-emitting diode, connected to its output side. Therefore, the conventional transmitter used in such a driver has been designed with reference to a case wherein a maximum current is supplied thereto, e.g., a remote control code signal of a continuous wave format is used. In this case, when the different output wave formats are used, a current supplied to the transmitter increases or decreases, thus varying an effective output of the transmitter. As a result, a controllable range of the remote control transmitter differs in accordance with the selected electric devices, thus confusing a user. Typical output wave formats will be exemplified below. For example, in a continuous wave format, a ratio of a pulse burst period to a pulse off period, i.e., a duty ratio, is 50%. In a gated carrier format, the duty ratio is 3 to 10%, and in a single pulse format, the duty ratio is 0.5 to 1%. Therefore, when a circuit is designed such that a current of 100 mA is supplied to a transmitter in the continuous wave format, only a current of 20 mA and a current of 2 mA are supplied thereto in the gated carrier and single pulse formats, respectively. As a result, the transmission distances of the transmitter output in the gated carrier and single pulse formats are shorter than that in the continuous wave format.

SUMMARY OF THE INVENTION

It is therefore an object of the present invention to provide an transmitter driver for a programmable remote control transmitter with which a remote control range will not be substantially changed regardless of different electric devices selected by a user.

In order to achieve the above object of the present invention, the output load of an output transistor in a transmitter driver constituting a remote control transmitter is changed in accordance with a selected output wave format. With this arrangement, a current supplied to a transmitter can be made substantially constant regardless of the output wave formats, and the transmission distance of the transmitter output can also be made constant. Therefore, this will not confuse a user unlike a conventional transmitter in which a remote control range differs in acordance with a selected electric device.

Therefore, according to an aspect of the present invention, there is provided a transmitter driver for a programmable remote control transmitter for receiving remote control codes for remote-controlling various electric devices in a learning mode and for remote-controlling the electric devices according to the received remote control codes in a remote control mode, comprising an output transistor for driving a transmitter constituting a part of a load upon reception of electrical pulses representing the remote control code, a resistor device arranged between the output side of the output transistor and a given reference potential, and a control transistor device, output electrodes of which are arranged between one end of the resistor device at the side of the output transistor and the reference potential, and an input electrode of which receives a control signal corresponding to an output signal format of remote control codes necessary for controlling an electric device selected by a user.

BRIEF DESCRIPTION OF THE DRAWINGS

FIG. 3 is a table showing conversion codes of reference bin pattern setting circuits respectively built into first and fourth repetition pattern discriminators in FIG. 1;

FIG. 4 is a table showing conversion codes of reference bin pair pattern setting circuits respectively built into second and third repetitive pattern discriminators in FIG. 1;

FIG. 5 is a circuit diagram of an embodiment of a transmitter driver for a remote control transmitter of the present invention; and FIG. 6 is a circuit diagram of the modification of the transmitter driver for a remote control transmitter of the present invention.

DETAILED DESCRIPTION OF THE PREFERRED EMBODIMENTS

Figure 1:
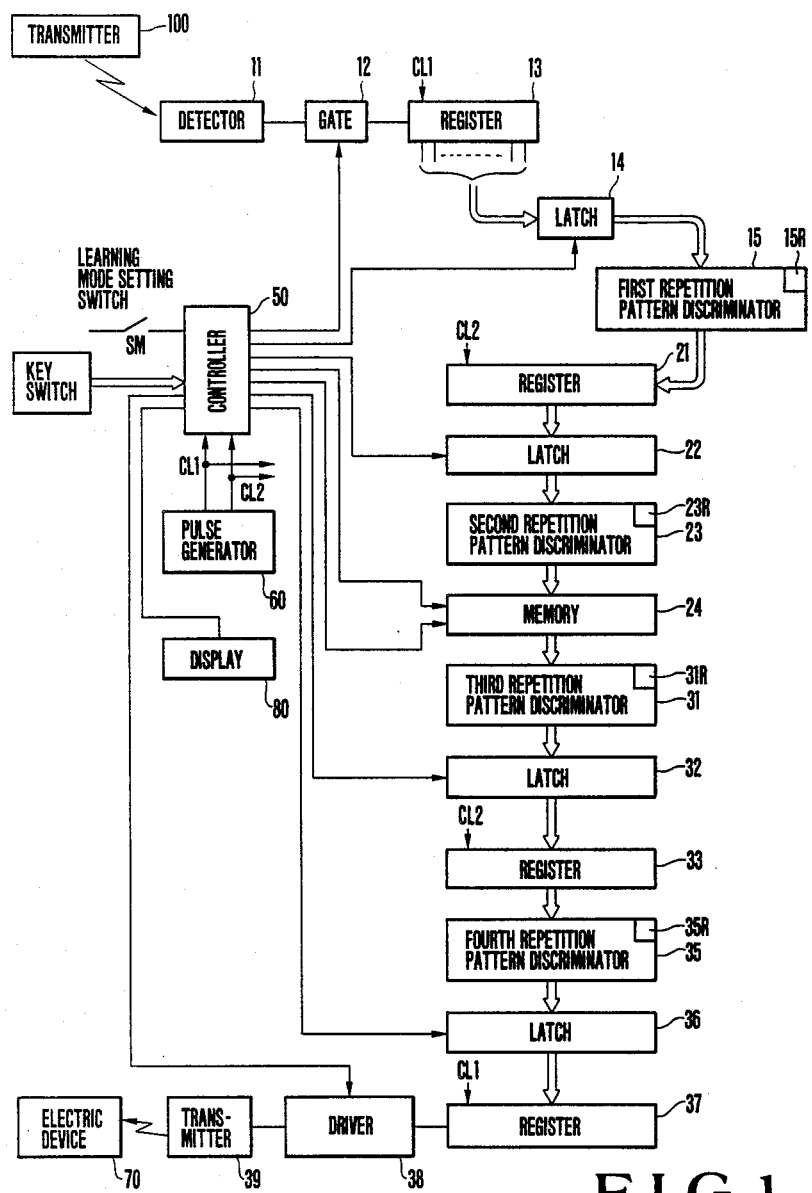
FIG. 1 is a block diagram of a programmable remote control transmitter according to an embodiment of the present invention.

FIG. 1 shows the basic arrangement of a programmable remote control transmitter according to an embodiment of the present invention. First, the operation of the remote control transmitter will be described with reference to FIG. 1. Referring to FIG. 1, the transmitter comprises a detector 11 for receiving an infrared or ultrasonic remote control code from a transmitter 100 for an electric device in the learning mode. The detector 11 also has a waveshaping function. The remote control code sent from the transmitter 100 for the electric device has variable pulse burst and variable pulse off periods, as shown in FIG. 2A. An output from the detector 11 is supplied to a register 13 through a gate 12. The register 13 also sequentially receives outputs from the detector 11 in response to one (i.e., a clock CL1) of the clocks sent from a pulse generator 60. Each output from the detector 11 is classified into a pulse burst period and the subsequent pulse off period. Parallel outputs from the register 13 are supplied to a first repetition pattern discriminator 15 through a latch 14. The first repetition pattern discriminator 15 discriminates which predetermined bin pattern corresponds to the pulse burst or pulse off pattern represented by the output from the register 13 and performs first data compression. The first repetition pattern discriminator 15 measures the pulse off period and the number of pulses during the pulse burst period. The resultant count and the off period are compared with preset bin patterns stored in a reference bin pattern setting circuit 15R built into the first repetition pattern discriminator 15. If a coincidence between the input data and the stored pattern is detected, a bin code corresponding to the bin pattern is sent out from the first repetition pattern discriminator 15. Comparison may be performed in units of input remote control codes or for all input remote control codes at once. The bin code from the first repetition pattern discriminator 15 is supplied to a register 21. The register 21 receives the bin code in response to one (i.e., a clock CL2) of the clocks from the pulse generator 60. A parallel signal is output from the register 21. The parallel signal is supplied to a second repetition pattern discriminator 23 through a latch 22.

The second repetition pattern discriminator 23 operates in a different manner from the first repetition pattern discriminator 15. More specifically, the second repetition pattern discriminator 23 compares a pair of adjacent ones of the bin codes obtained by the first repetition pattern discriminator 15 with a reference bin pair code pattern prestored in a reference bin pair pattern setting circuit 23R incorporated therein. Comparison may be performed in units of bin pair codes or for all bin pair codes at once. Data obtained by second data compression in this manner are stored in a predetermined area in a memory 24.

The learning process described above is repeated in units of command or operation keys arranged in the transmitter for each electric device, and compressed data corresponding to control data sent from each key are stored in the memory 24.

The above operation is performed for several electric devices, and data required for remote-controlling them are stored in the memory 24.

The data stored in the memory 24, as described above, are read out by the following circuit arrangement in the normal operation mode, i.e., the remote control mode.

In the remote control mode, the control mode corresponding to the electric device to be remote-controlled by the operator is selected, and an operation key (not shown) is operated. A controller 50 accesses the memory 24 in response to the key data from the operated key, and the compressed data is read out from a memory area at the designated address. The readout data is supplied to a third repetition pattern discriminator 31. The third repetition pattern discriminator 31 performs the operation opposite to that of the second repetition pattern discriminator 23, i.e., converts the bin pair code to the bin code. The input bin pair code is compared with a reference bin pair code pattern prestored in a reference bin pair pattern setting circuit 31R and is converted into a corresponding bin code. The converted bin code is supplied to a register 33 through a latch 32 and stored therein. The register 33 receives the bin code in response to the clock CL2 sent from the pulse generator 60. The content of the register 33 is sent to a fourth repetition pattern discriminator 35. The fourth repetition pattern discriminator 35 converts the bin code into an electrical signal of a remote control code consisting of pulse burst and pulse off components, in a manner opposite to that of the first repetition pattern discriminator 15. More specifically, the input bin code is compared with a reference bin code pattern prestored in a reference bin pattern setting circuit 35R built into the fourth repetition pattern discriminator 35 and is converted into a corresponding remote control code. The remote control code is stored in a register 37 through a latch 36. The register 37 sequentially supplies remote control codes to a transmitter (LED) driver 38 in response to the clocks CL1 from the pulse generator 60. An infrared or ultrasonic remote control code signal is sent to an electric device 70 through a transmitter 39 to control the electric device 70. The LED driver 38 is a characteristic feature of the present invention. When a user selects an electric device to be controlled, an output wave format suitable for the selected device is also specified. Therefore, a load corresponding to the specified output wave form is selected by the controller 50. This will be described later with reference to FIGS. 5 and 6.

Referring to FIG. 1, reference numeral 80 denotes a display for displaying functions, modes and commands for operating the remote control transmitter. Reference symbol SM denotes a switch for setting a learning mode. The switch SM is manually operated. The controller 50 generates various control signals at predetermined timings in response to clock pulses supplied from the pulse generator 60 so as to control the operation of the gate 12, the latches 14, 22, 32, and 36, and the memory 24. The control signals can be generated by techniques known to those skilled in the art, and a detailed description thereof will be omitted.

Figure 2:
FIGS. 2A to 2C are schematic charts for explaining the operation of the transmitter shown in FIG. 1.

With the above arrangement, the operations of the first to fourth repetition pattern discriminators 15, 23, 31, and 35 as the main feature of the present invention will be described with reference to FIGS. 2 to 4.

In the learning mode, the remote control code signal in FIG. 2A is supplied as an operation key signal from the transmitter 100 for the electric device. Numeric values written on the pulses of the burst periods represent the numbers of pulses constituting the pulse burst periods. The times written below the signal represent pulse off periods. Therefore, there are two types of pulse burst components respectively having five and three pulses, and two types of pulse off periods as 100 ms and 50 ms.

The remote control signal is waveshaped by the detector 11. The waveshaped signal is supplied to the first repetition pattern discriminator 15 through the register 13. The first repetition pattern discriminator 15 compares the input electrical signal with the reference bin patterns stored in the reference bin pattern setting circuit 15R. The conversion codes shown in FIG. 3 are stored in the reference bin pattern setting circuit 15R. When the electrical signal in FIG. 2A is supplied to the first repetition pattern discriminator 15, it converts the pulse burst "5" into a bin code "A". The pulse off period "100 ms" following the pulse burst "5" is converted into a bin code "C". The pulse burst "3" following the pulse off period "100 ms" is converted into a bin code "B". The pulse off period "50 ms" following the pulse burst "3" is converted into a bin code "D". The electrical signals are sequentially converted into bin codes in the same manner as described above. The array of bin codes is shown below the corresponding signal components in FIG. 2B.

The bin code array is supplied to the second repetition pattern discriminator 23 through the register 21 and the latch 22. The bin code array is compared with the reference bin pair patterns stored in the reference bin pair pattern setting circuit 23R. The conversion codes in FIG. 4 are stored in the reference bin pair pattern setting circuit 23R. The second repetition pattern discriminator 23 discriminates coincidences between the bin pair codes shown in FIG. 4 and the combinations each consisting of two adjacent bin codes. The first combination "AB" of two adjacent bin codes corresponds to a bin pair code "I" and is converted thereinto. The second combination "CD" of two adjacent bin codes corresponds to a bin pair code "II" and is converted thereinto. The third combination "CD" of two adjacent bin codes corresponds to the bin pair code "II" and is converted thereinto. The subsequent combinations each consisting of two adjacent bin codes are converted into the corresponding reference bin pair codes. An array of resultant bin pair codes is shown in FIG. 2C below the corresponding bin codes in FIG. 2B. The bin pair codes are stored as compressed data in the memory 24.

The third repetition pattern discriminator 31 converts the bin pair code to a combination of two adjacent bin codes in a manner opposite to that of the second repetition pattern discriminator 23. Each compressed data, i.e., each bin pair code, read out from the memory 24 is converted into the corresponding combination of two adjacent bin codes according to the conversion codes (FIG. 4) stored in the reference bin pair pattern setting circuit 31R built into the third repetition pattern discriminator 31. For example, if the bin pair code is "III", the combination "AC" of two adjacent bin codes is obtained as a conversion output. Similarly, if the bin pair code is "II", the combination "CD" of two adjacent bin codes is obtained as a conversion output. If the bin pair code is "I", the combination "AB" of two adjacent bin codes is obtained as a conversion output. The resultant combinations each consisting of two adjacent bin codes are supplied to the register 33 through the latch 32 and stored therein.

The fourth repetition pattern discriminator 35 converts each combination of two adjacent bin codes into remote control codes in a manner opposite to the first repetition pattern discriminator 15. An array of the bin code combinations read out from the register 33 is converted to a remote control code electrical signal according to the conversion codes (FIG. 3) stored in the reference pattern setting circuit 35R built into the fourth repetition pattern discriminator 35. For example, a pulse signal constituting the pulse burst "5" is obtained as a conversion output for the bin code "A". Similarly, a pulse off period "100 ms" is obtained as a conversion output for the bin code "C". A pulse signal constituting the pulse burst "3" is obtained as a conversion output for the bin code "B". A pulse off period "50 ms" is obtained as a conversion output for the bin code "D".

The array of the remote control codes is sent to the register 37 through the latch 36.

The detailed arrangement and the operation of the LED driver 38 as the main feature of the present invention will be described hereinafter with reference to FIGS. 5 and 6.

FIG. 5 is a detailed circuit diagram of the LED driver 38 shown in FIG. 1. Referring to FIG. 5, reference symbol T1 denotes an NPN output transistor, the base of which receives remote control codes from the register 37 shown in FIG. 1 through a resistor R1. The collector of the transistor T1 is connected to one end of a light-emitting diode LED constituting the transmitter 39 through a resistor R2. The other end of the light-emitting diode LED is connected to a power source +V. The emitter of the transistor T1 is connected to a ground potential through a resistor R3. Reference symbol T2 denotes a control transistor for changing an output load. The collector of the transistor T2 is connected to a node between the emitter of the transistor T1 and the resistor R1, the emitter is connected to a ground potential, and the base is connected to the controller 50 through a resistor R4. The controller 50 supplies, to the base of the transistor T2 through the resistor R4 and a control terminal A, a control signal suitable for a load corresponding to the output signal format used in an electric device selected by a user. In this case, assuming that the output signal formats of electric devices controlled by this remote control transmitter include the continuous wave format, the gated carrier format, and the single pulse format, the control transistor T2 receives the control signals shown in Table 1 from the controller 50.

TABLE 1

|  | Single Pulse Format | Gated Carrier Format | Continuous Wave Format |
| --- | --- | --- | --- |
| Transistor T2 | ON | ON | OFF |

Since there is only a slight difference between the duty ratios of the single pulse format and the gated carrier format, the same load of the output transistor T1 is used for these formats. More specifically, in the single pulse format and the gated carrier format, the controller 50 supplies the control signal to the base of the transistor T2 to turn it on. Therefore, the emitter of the output transistor T1 is connected directly to the ground potential without being through the resistor R3. As a result, a large current is supplied to the light-emitting diode LED. In contrast to this, in the continuous wave format, no control signal is supplied to the base of the control transistor T2. Therefore, the emitter of the transistor T1 is connected to the ground potential through the resistor R3. As a result, a small current is supplied to the light-emitting diode LED.

In this manner, when the load of the LED driver is changed, a current supplied to the transmitter can be made constant regardless of the output signal formats. In addition, the transmission distance of the transmitter output can be also made constant. Therefore, a user will not be confused of different remote control ranges in accordance with selected electric devices unlike in the conventional transmitter.

FIG. 6 shows a modification of the circuit shown in FIG. 5. The load of the output transistor can be correctly set with respect to the remote control codes in any of the single pulse, gated carrier, and continuous wave formats. The same reference numerals in FIG. 6 denote the same parts as in FIG. 5. Referring to FIG. 6, the emitter of an output transistor T1 is connected to the ground potential through resistors R3 and R5. The collector of a control transistor T3 is connected to a node between the resistors R3 and R5, and the emitter thereof is connected to the ground potential. The base of the control transistor T3 receives a control signal from the controller 50 through a resistor R6 and a control terminal B. Assuming that the output signal formats of electric devices controlled by this remote control transmitter includes the continuous wave, gated carrier, and single pulse formats, the control transistors T2 and T3 receive the control signals shown in Table 2 below from the controller 50.

TABLE 2

|  | Single Pulse Format | Gated Carrier Format | Continuous Wave Format |
| --- | --- | --- | --- |
| Transistor T2 | ON | OFF | OFF |
| Transistor T3 | OFF | ON | OFF |

In the single pulse format, the controller 50 supplies the control signal to the base of the control transistor T2 to turn it on. Therefore, the emitter of the output transistor T1 is connected directly to the ground potential without being through the resistor R3. As a result, a large current is supplied to the light-emitting diode LED. In this case, no control signal is supplied to the control transistor T3. Therefore, the transistor T3 is kept off. In contrast to this, in the gated carrier format, no control signal is supplied to the base of the control transistor T2, and a control signal is supplied to the base of the control transistor T3. Therefore, the emitter of the output transistor T1 is connected to the ground potential through the resistor R3. As a result, a medium current is supplied to the light-emitting diode LED. In the continuous wave format, no control signal is supplied to the base of the control transistor T2. Therefore, the emitter of the transistor T1 is connected to the ground potential through the resistors R3 and R4. As a result, a small current is supplied to the light-emitting diode LED.

In this manner, when the load of the LED driver is changed, a current supplied to the transmitter can be made constant regardless of the output signal formats. In addition, the transmission distance of the transmitter output can be also made constant. Therefore, a user will not be confused of different remote control ranges in accordance with selected electric devices unlike the conventional transmitter.

The format of the remote control code is not limited to the one used in the above description. Other various code formats may be utilized.

Although NPN transistors are used in the embodiment in FIGS. 5 and 6, other type of transistors, e.g., FETs may also be used.

In the embodiment shown in FIGS. 5 and 6, the bias potentials of the transistors are not limited to those described therein, as a matter of course.

In the above embodiment, the operation is performed by hardware. However, the same operation as described above may be performed by a combination of a computer and software. In this case, the reference bin pattern setting circuits incorporated in the first and fourth repetition pattern discriminators 15 and 35 can be constituted by a single circuit. The same is true for the reference bin pair pattern setting circuits incorporated in the second and third repetition pattern discriminators 23 and 31.

According to the programmable remote control transmitter of the present invention as described above, the load of the transmitter driver is changed in correspondence with the output signal format, so that a current supplied to the transmitter can be made constant regardless of the output signal formats, and the transmission distance of the transmitter output can also be made constant. Therefore, a user will not be confused of different remote control ranges corresponding to selected electric devices unlike in a conventional transmitter.

What is claimed is:

1. A transmitter driver for a programmable remote control transmitter capable of receiving different remote control codes for remote-controlling various electric devices, respectively, and storing information representative thereof in a memory in a learning mode and for remote-controlling the electric devices according to the received remote coontrol codes in a remote control mode, and including apparatus for ensuring consistent control of said various electrical devices despite the differences between said remote control codes comprising:

an output transistor for driving a transmitter constituting a part of a load upon reception of electrical pulses representing the remote control codes;
a resistor device arranged between an output side of said output transistor and a given reference potential; and
a control transistor device, output electrodes of which are arranged between one end of said resistor device at said output side of said output transistor and said reference potential;
an input electrode of said control transistor device receiving a control signal indicating an output signal format of a remote control code corresponding to one of said electric devices selected by a user.

2. A driver according to claim 1, wherein
said resistor device is constituted by a plurality of series-connected resistors;
said control transistor device comprises a plurality of control transistors, an output electrode of each of which is arranged between one end of each of said resistors at said output side of said output transistor and said reference potential; and
a different control signal is supplied to input electrodes of said control transistors of said control transistor device in correspondence with the output signal format of a remote control code necessary for controlling an electric device selected by a user.

3. A driver according to claim 1, wherein said transmitter is a light-emitting diode.

4. In a remote control transmitter capable of generating a remote control signal with one of a plurality of selectable different code formats corresponding to respective different controlled devices, apparatus for ensuring consistent control of said different controlled devices despite the differences between said remote control codes, comprising:

means for generating a control signal indicative of the selected one of said plurality of code formats;

a transistor driver for driving a transmitter element to produce said remote control signal upon reception of an electrical signal encoded with said selected code format; and control means coupled to said output transistor amplifier for controlling the level of said remote control signal in response to said control signal indicative of said selected code format.

* * * * *

UNITED STATES PATENT AND TRADEMARK OFFICE
CERTIFICATE OF CORRECTION

PATENT NO. : 4,769,643

DATED : September 6, 1988

INVENTOR(S) : Akira Sogame

It is certified that error appears in the above-identified patent and that said Letters Patent is hereby corrected as shown below:

Column 1, line 16, after "a" and before "another" insert -- transmitter for a given electric device cannot be used for --.

Signed and Sealed this

Twelfth Day of March, 1991

Attest:

HARRY F. MANBECK, JR.

Attesting Officer

Commissioner of Patents and Trademarks